(12) United States Patent
Ruan et al.

(10) Patent No.: US 11,867,763 B2
(45) Date of Patent: Jan. 9, 2024

(54) METHOD FOR MONITORING CIRCUIT BREAKER AND APPARATUS AND INTERNET OF THINGS USING THE SAME

(71) Applicant: ABB Schweiz AG, Baden (CH)

(72) Inventors: Jiayang Ruan, Beijing (CN); Niya Chen, Beijing (CN); Rongrong Yu, Beijing (CN)

(73) Assignee: ABB SCHWEIZ AG, Baden (CH)

( * ) Notice: Subject to any disclaimer, the term of this patent is extended or adjusted under 35 U.S.C. 154(b) by 49 days.

(21) Appl. No.: 17/136,116

(22) Filed: Dec. 29, 2020

(65) Prior Publication Data

US 2021/0116504 A1    Apr. 22, 2021

Related U.S. Application Data

(63) Continuation of application No. PCT/CN2018/099534, filed on Aug. 9, 2018.

(51) Int. Cl.
    *G01R 31/327* (2006.01)

(52) U.S. Cl.
    CPC .............. *G01R 31/3275* (2013.01)

(58) Field of Classification Search
    None
    See application file for complete search history.

(56) References Cited

U.S. PATENT DOCUMENTS

| 4,980,844 A | 12/1990 | Demjanenko et al. |
| 5,251,151 A * | 10/1993 | Demjanenko ............ G01H 1/00 702/56 |
| 7,275,018 B2 * | 9/2007 | Abu-El-Zeet .......... G06Q 10/06 702/182 |

(Continued)

FOREIGN PATENT DOCUMENTS

| CN | 103064019 A | 4/2013 |
| CN | 103336243 A | 10/2013 |

(Continued)

OTHER PUBLICATIONS

Cheng et al.; High Pressure Breaker Action Property Analyzing Method Based on Multi-grid Density Clustering; CN 104713714 A; Jun. 17, 2015; G01M13/00 (Year: 2015).*

(Continued)

*Primary Examiner* — Nasima Monsur
(74) *Attorney, Agent, or Firm* — Greenberg Traurig, LLP (57) ABSTRACT

A method and system for monitoring condition of a fleet of circuit breakers includes: measuring at least one type of operating condition related signal for the respective circuit breakers during their operation; obtaining a set of feature data representing the respective measurements of operating condition related signal; performing cluster analysis of the set of feature data based on a similarity threshold; and generating a signal indicating the condition of the fleet of circuit breakers based on the resulting cluster number. Rather than comparing the data representing the measurements of operating condition related signal to a reference model built on CB's normal data, the method includes applying cluster analysis of the set of feature data representing the respective measurements of operating condition related signal. The method does not need a reference "normal" database for comparison.

11 Claims, 10 Drawing Sheets

(56) References Cited

U.S. PATENT DOCUMENTS

| | | | |
|---|---|---|---|
| 9,360,908 B2 | 6/2016 | Alshinnawi et al. | |
| 2016/0358722 A1* | 12/2016 | Lakshmanan | H01H 47/22 |
| 2017/0047184 A1* | 2/2017 | Ashtekar | H01H 71/04 |
| 2018/0025877 A1 | 1/2018 | Froehner et al. | |

FOREIGN PATENT DOCUMENTS

| | | | |
|---|---|---|---|
| CN | 103487749 A | 1/2014 |
| CN | 104281899 A | 1/2015 |
| CN | 104713714 A | 6/2015 |
| CN | 106093771 A | 11/2016 |
| CN | 107085183 A | 8/2017 |
| CN | 107358366 A | 11/2017 |
| CN | 107525993 A | 12/2017 |

OTHER PUBLICATIONS

Intellectual Property Office of the P.R. China, International Search Report & Written Opinion issued in corresponding Application No. PCT/CN2018/099534, dated May 9, 2019, 9 pp.

Dehghanian et al., "Circuit Breaker Operational Health Assessment via Condition Monitoring Data," IEEE 2014 North American Power Symposium, Sep. 7-9, 2014, 6 pp.

Extended European Search Report, issued by the European Patent Office, regarding corresponding patent application Serial No. EP18929030.7; dated Feb. 22, 2022; 8 pp.

\* cited by examiner

METHOD FOR MONITORING CIRCUIT BREAKER AND APPARATUS AND INTERNET OF THINGS USING THE SAME

TECHNICAL FIELD

The invention relates to the field of circuit breaker, and more particularly to monitoring health condition of a fleet of circuit breakers.

BACKGROUND ART

Circuit breaker (CB) is one of the most critical components of a substation, whose safety and reliability are of high importance to the overall power grid. The market of smart circuit breaker is increasing rapidly these years, especially with the world's growing attention on digital products. Therefore, it's desired by the market a kind of smart circuit breaker being able to real-time monitor its defects and severity thereof before evolving to real failure, namely to monitor its health condition before real failure occurring.

The purpose of machine condition monitoring is to detect faults as early as possible to avoid further damage to machines. Traditionally, physical models were employed to describe the relationship between sensors that measure performance of a machine. Violation of those physical relationships could indicate faults. However, accurate physical models are often difficult to acquire.

An alternative to the use of physical models is the use of statistical models based on machine learning techniques. That approach has gained increased interest in recent decades. In contrast to a physical model, which assumes known sensor relationships, a statistical model learns the relationships among sensors from historical data. That characteristic of the statistical models is a big advantage in that the same generic model can be applied to different machines. It is disclosed in patent publication CN 107 085 183 A of a kind of machine learning algorithm based on nonlinear regression to make condition monitoring of circuit breaker. The concept of this algorithm is to build a data-driven model for the CB based on its own normal data, and if the newly coming data deviates from the reference model, it represents the CB is becoming abnormal. To be able to use statistical models for machine condition monitoring, it is necessary to train the model based on historical data with condition stamp. In a classification-based model, a data point stamp may be either "normal" (representing good data) or "abnormal" (representing data indicating a fault).

At least one disadvantage, however, exists in the approach. It has to train the model of the algorithm based on condition stamp historical data in "normal" and/or "abnormal" condition. This would take a relatively long period to collect those sort of data concerning a new CB in the fleet or those occasionally trigger during a year, which makes the model training process time-consuming or even intractable.

BRIEF SUMMARY OF THE INVENTION

According to an aspect of present invention, it provides a method for monitoring condition of a fleet of circuit breakers, including steps of: (a) measuring at least one type of operating condition related signal for the respective circuit breakers during their operation; (b) obtaining a set of feature data representing the respective measurements of operating condition related signal; (c) performing cluster analysis of the set of feature data based on a similarity threshold; and (d) generating a signal indicating the condition of the fleet of circuit breakers based on the cluster number resulted from the step (c).

According to another aspect of present invention, it provides a system for monitoring condition of a fleet of circuit breakers, including: at least one sensor, being configured to measure at least one type of operating condition related signal for the respective circuit breakers during their operation; and a controller, being configured to: obtain a set of feature data representing the respective measurements of operating condition related signal; perform cluster analysis of the set of feature data based on a similarity threshold; and generate a signal indicating the condition of the fleet of circuit breakers based on the cluster number resulted from the performance of the cluster analysis.

According to another aspect of present invention, it provides an internet of things, including: the fleet of the circuit breakers, the system for monitoring condition of the fleet of circuit breakers, and a server, being configured to receive the signal indicating the condition of the fleet of circuit breakers.

Rather than comparing the data representing the measurements of operating condition related signal to a reference model built on CB's normal data, the embodiment according to present invention applies cluster analysis of the set of feature data representing the respective measurements of operating condition related signal. Cluster analysis or clustering is the task of grouping a set of objects in such a way that objects in the same group (called a cluster) are more similar (in some sense) to each other than to those in other groups (clusters). The cluster analysis uses one of the algorithms including connectively-based clustering, centroid-based clustering, distribution-based clustering, and density-based clustering. By utilizing unsupervised machine learning method to identify abnormally operating CBs in a fleet by comparing its data with those of its neighbours, the one who is behaving differently from neighbours would be identified as a defective one. The method does not need a reference "normal" database for comparison.

Preferably, the following criteria is applicable for monitoring condition of the fleet of circuit breakers, where the signal is considered to indicate the abnormal condition of the fleet of circuit breakers where the cluster number is above one. Preferably, the signal's indication of the abnormal condition includes identifying the circuit breaker as abnormal where the feature data representing its operating condition related signal was grouped in the cluster having the less number of feature data than at least one of the rest of the clusters.

Preferably, the at least one type of operating condition related signal is selected from travel curve signal, vibration signal, coil current signal, motor current signal, and PD signal of the circuit breaker.

Preferably, the measurements are substantially synchronously performed.

Preferably, the feature data are processed so as to remove its components insignificantly representing the abnormal condition of the circuit breaker.

Preferably, the similarity threshold are calculated and obtained from history profile of the fleet of circuit breakers.

Preferably, a signal is generated indicating a level of normal condition for each of the circuit breakers whose feature data were grouped in the rest of the clusters based on its similarity with the rest of circuit breakers in the same cluster. This is helpful to evaluate how far a new sample is deviated from the normal cluster. The simplest idea is to calculate the Euclidian distance between the tested feature data and the centre of the normal cluster.

BRIEF DESCRIPTION OF THE DRAWINGS

The subject matter of the invention will be explained in more detail in the following text with reference to preferred exemplary embodiments which are illustrated in the drawings, in which.

PREFERRED EMBODIMENTS OF THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods and programming procedures, devices, and circuits are omitted so not to obscure the description of the present invention with unnecessary detail.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

Figure 1:
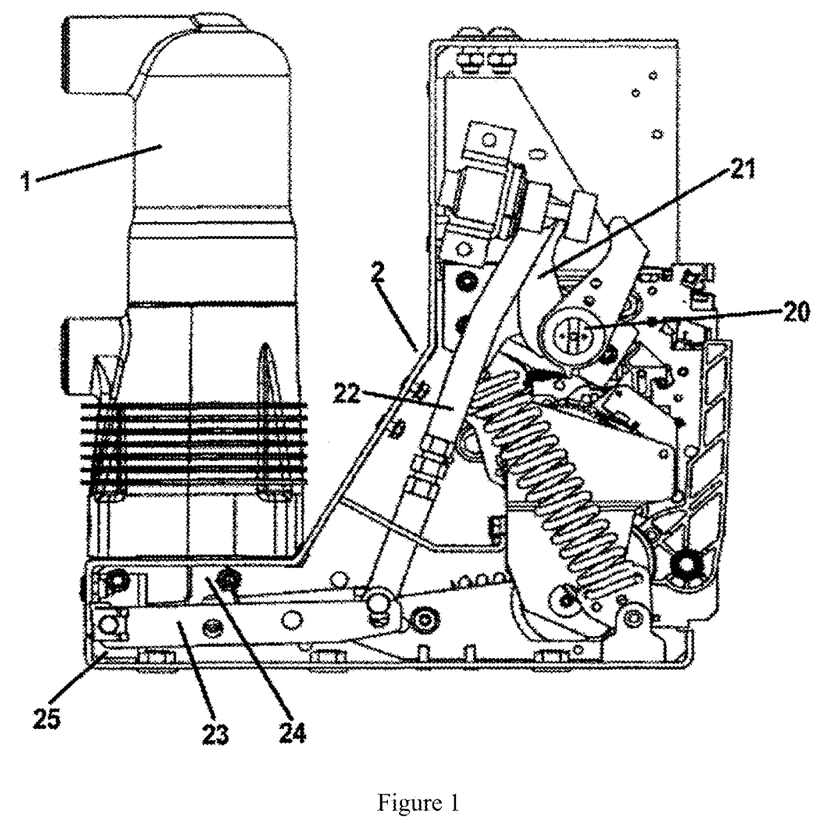
FIG. 1 illustrates an exemplary circuit breaker of a fleet which can be on-line monitored by the method according to an embodiment of the present invention.

FIG. 1 illustrates an exemplary circuit breaker of a fleet which can be on-line monitored by the method according to an embodiment of the present invention. The circuit breaker as shown in FIG. 1 is a vacuum circuit breaker, comprising a stationary contact and a movable contact (not shown) enclosed in an insulation pole 1, and an actuating mechanism 2 for actuating the closing and opening action of the movable contact. The actuating mechanism 2 has a plurality of elements including a linkage mechanism and a spring. The linkage mechanism is for transmitting a driving force from an active element for example, a motor or the spring actuator, to the movable contact. As shown in FIG. 1, for example, the linkage mechanism may be a four-bar linage which comprises a first lever 21, a second level 22, a third lever 23 pivotally connected to each other in sequence. The first lever 21 is connected to a driving shaft 20 driven by an active element, and the third lever 23 is pivotally connected to a fixed point 25 on the base of the circuit breaker. For example, the fixed point 25 may be one of the fulcrums of the linkage mechanism. A push rod 24 on one end is pivotally connected to the movable contact at a distance from the pivot point between the third level 23 and the fixed point 25. The other end of the push rod 24 is connected to the movable contact in the insulation pole 1. By driving the driving shaft 20 rotating via the motor 26 or the spring, the movable contact can be moved up and down in a longitudinal direction in the pole 1 by the force transmission from the first lever 21, the second level 22, the third lever 23 and the push rod 24, so as to contact or be separated from the stationary contact and thus close or open the circuit. The circuit breaker as shown in FIG. 1 may include a magnetic actuator arrangement (not shown in FIG. 1), comprising electromagnetic coil, electrical supply means for supplying the coil electric current to the coil, a latch for securing the circuit breaker's door closed capable of moving between first and second extreme positions within the magnetic actuator under influence of the coil, and electronic switch means for energising and de-energising the coil.

Figure 2:
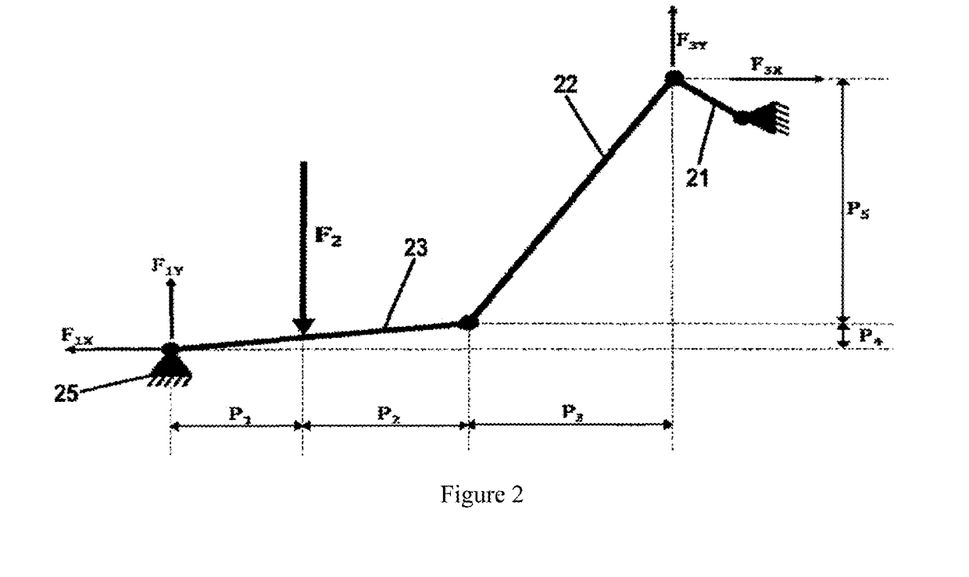
FIG. 2 illustrates the force applied on the linkage mechanism of the circuit breaker as shown in FIG. 1.

FIG. 2 illustrates the force applied on the linkage mechanism of the circuit breaker as shown in FIG. 1. In a balanced closed state of the circuit breaker, the movable contact abuts against the stationary contact under a force from the linkage mechanism. In this case, the stationary contact would apply a counter force F2 (also referred to as contact force) on the movable contact which is in turn conducted to the third lever 23 through the push rod 24. Once the movable contact is separated from the stationary contact in the opening period, the counter force F2 on the movable contact, the push rod 24 and the third lever 23 would decrease dramatically and even become zero. Likewise, during the closing period of the circuit breaker, the counter force F2 applied on the movable contact by the stationary contact would dramatically from zero to a relative high value.

The operating condition related signal of the circuit breaker includes at least one of the below types:
a. travel curve signal of movable contact of the CB;
b. vibration signal for opening/closing of movable contact of the CB;
c. opening/closing coil electric current signal of the CB;
d. motor current signal of the CB; and
e. PD signal of the CB.

The travel of the movable contact refers to the distance from where the movable contract starts to move until it reaches a position where the arcing contacts meet per design. This position is referred to as the "travel" and is measured from the fully closed position.

Vibration of the movable contact refers to a series of rebounds happening during the period from the first contact between movable contact and stationary contact to the eventual reliable contact established or vice versa.

Opening/closing coil electric current of the circuit breaker. The circuit breaker as shown in FIG. 1 may include a magnetic actuator arrangement, comprising electromagnetic coil, electrical supply means for supplying the coil electric current to the coil, a latch for securing the circuit breaker's door closed capable of moving between first and second extreme positions within the magnetic actuator under influence of the coil, and electronic switch means for energising and de-energising the coil.

Motor current signal of the CB. The actuating mechanism 2 of FIG. 1 has a plurality of elements including a linkage mechanism and a spring. The linkage mechanism is for transmitting a driving force from an active element for example, a motor or the spring actuator, to the movable contact. The motor current drives the motor which, in turn, provides the driving force for the linkage mechanism.

PD signal of the CB refers to partial discharge of the CB which could happened in places like surface or inside of solid insulation material, or any metal part that is under electrical stress. Partial discharge (PD) is a localized dielectric breakdown (DB) of a small portion of a solid or fluid electrical insulation system under high voltage stress, which does not bridge the space between two conductors.

A circuit breaker having the defect can still operate but will eventually develop into a failure. A defect stage occurs between normal stage and failure stage. A defect of CB results in an abnormity of those operating condition related signals. Accordingly, in order to improve reliability and accuracy of diagnosis of the health status of the circuit breaker, at least one of the operating conditions may be monitored. The present invention provides a highly sensitivity and highly accurate abnormality diagnosing solution using those operating condition related parameters of the CB during its operation. A first embodiment using one of the operating condition related parameters, for example travel curve signal of movable contact of the CB, is described thereafter for explaining the present invention. As an alternative, vibration signal for opening/closing of movable contact of the CB is considered for condition monitoring the fleet of CBs according to a second embodiment. The skilled person should understand that any one or more of the operating condition related parameters may be used for diagnosis of the health condition of the fleet of CBs.

Figure 3:
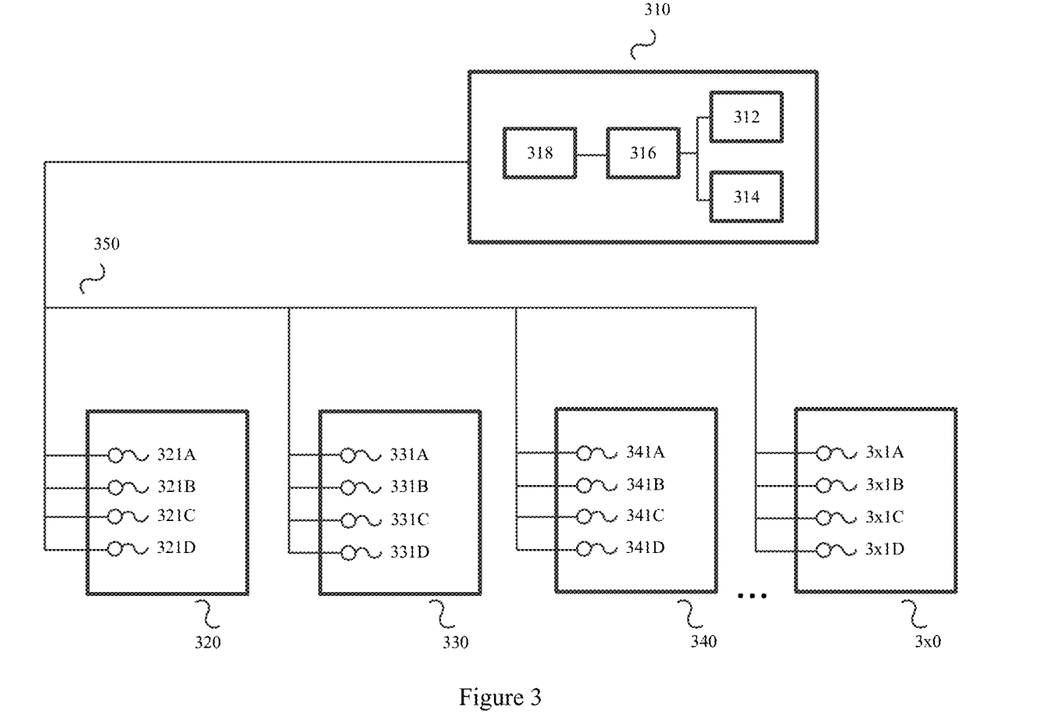
FIG. 3 shows a system for monitoring conditions of a fleet of CBs according to an embodiment of the invention.

A system 310 for monitoring conditions of a fleet of CBs 320, 330, 340 ..., 3x0 according to the first embodiment of the invention is shown in FIG. 3. The system includes at least one sensor such as the sensors 321A, 321B, 331A, 331B, 341A, 341B ..., 3x1A, 3x1B connected to the respective one of the CBs 320, 330, 340 in the fleet. The sensors may, for example, travel sensor 321A, 331A, 341A ..., 3x1A for measuring the travel of the movable contact, vibration sensor 321B, 331B, 341B ..., 3x1B for measuring the vibration signal for opening/closing of movable contact of the CB, current sensor for measuring opening/closing coil electric current signal of the CB, current sensor for measuring motor current signal of the CB, PD sensor for measuring PD signal of the CB, or any sensor that measures an operating condition related signal of a CB or process. The sensors measure conditions chosen because they are related in predictable ways that reflect the presence or absence of normal operating conditions in the fleet of CBs. How many sensors are used for a CB is contingent on how many types of operating condition related parameters are used for diagnosis of the health condition of the fleet of CBs.

The sensors 321A, 321B, 331A, 331B, 341A, 341B ..., 3x1A, 3x1B are connected through a data network 35 to a data interface 318 in the CB condition monitoring system 310. A controller 316 receives the sensor data from the data interface 318 and performs the monitoring methods of the invention. The controller 316 is connected to storage unit 312 for storing computer-readable instructions that, when executed, perform the monitoring methods. The storage unit 312 may also store data received from the sensors 321A, 321B, 331A, 331B, 341A, 341B ..., 3x1A, 3x1B. A user interface 314 is provided for communicating results to and receiving instructions from a user. For example, the controller 316 and the storage unit 312 and their software can be implemented in a cloud platform, preferably, the data interface 318 and user interface 314 can be implemented in the cloud platform as well. Based on the system configuration, an internet of things can be realized, which includes, the fleet of the circuit breakers 320, 330, 340 ..., 3x0, the system 310, and a server being configured to receive the signal indicating the condition of the fleet of circuit breakers.

Figure 3A:
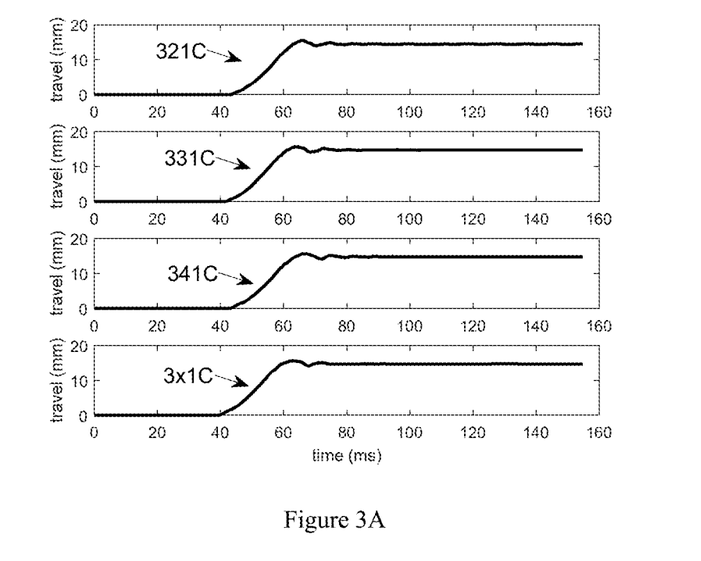
FIG. 3A and FIG. 3B are graphs of travel curves of the respective CBs in the fleet in opening and closing operation, with an x-axis indicative of time and a y-axis illustrating travel.
Figure 3B:
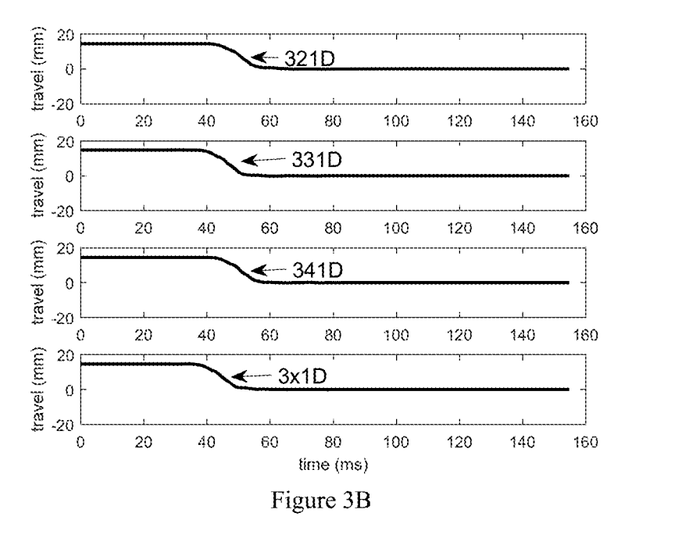

For example in the first embodiment where the travel curve signal of movable contact of the CB is used, the travel sensors 321A, 331A, 341A ..., 3x1A measure the travel of the movable contact of the respective CBs 320, 330, 340 ..., 3x0, and data 321C, 331C, 341C ..., 3x1C representing the travel curves of the respective CBs 320, 330, 340 ..., 3x0 in the opening operation and data 321D, 331D, 341D ..., 3x1D representing the travel curves of the respective CBs 320, 330, 340 ..., 3x0 in the closing operation are stored in the storage unit 312. FIG. 3A and FIG. 3B are graphs of travel curves of the respective CBs in the fleet in opening and closing operation, with an x-axis indicative of time and a y-axis illustrating travel. As shown in FIG. 3A, in the opening operation, the travel curves of the CBs 320, 330, 340 ..., 3x0 are indicated by respective reference signs 321C, 331C, 341C ..., 3x1C. As shown in FIG. 3B, in the closing operation, the travel curves of the CBs 320, 330, 340 ..., 3x0 are indicated by respective reference signs 321D, 331D, 341D ..., 3x1D.

Figure 4A:
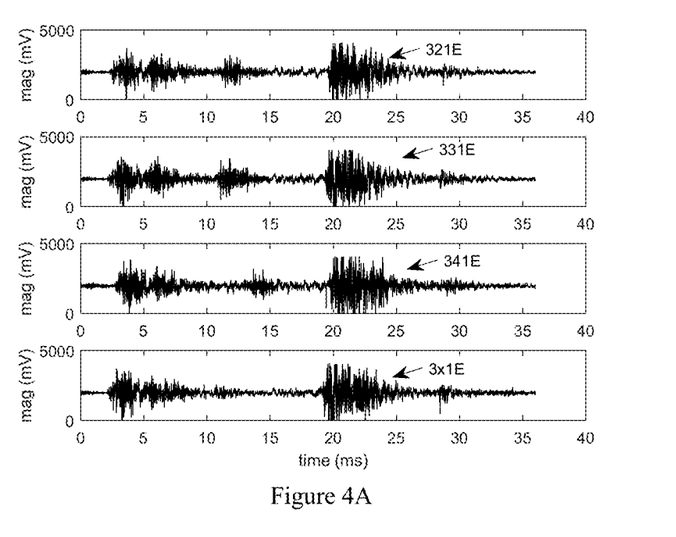
FIG. 4A and FIG. 4B are graphs of vibration signal curves of the respective CBs in the fleet in opening and closing operation.
Figure 4B:
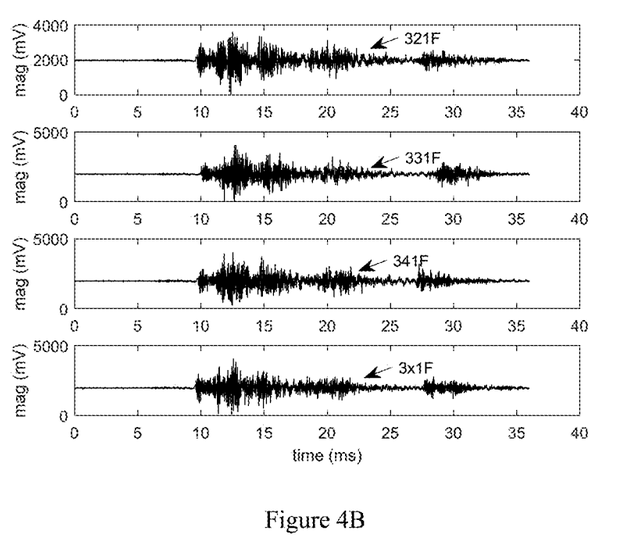

As an alternative, in the second embodiment where the vibration signal of movable contact of the CB is used, the vibration sensors 321B, 331B, 341B ..., 3x1B measure the vibration signals of the movable contact of the respective CBs 320, 330, 340 ..., 3x0 in the opening operation and in the closing operation, and data 321E, 331E, 341E ..., 3x1E representing the vibration curves of the respective CBs 320, 330, 340 ..., 3x0 in the opening operation and data 321F, 331F, 341F ..., 3x1F representing the travel curves of the respective CBs 320, 330, 340 ..., 3x0 in the closing operation are stored in the storage unit 312. FIG. 4A and FIG. 4B are graphs of vibration signal curves of the respective CBs in the fleet in opening and closing operation. As shown in FIG. 4A, in the opening operation, the vibration curves of the CBs 320, 330, 340 . . . , 3x0 are indicated by respective reference signs 321E, 331E, 341E . . . , 3x1E. As shown in FIG. 4B, in the closing operation, the vibration curves of the CBs 320, 330, 340 . . . , 3x0 are indicated by respective reference signs 321F, 331F, 341F . . . , 3x1F.

For example according to the first embodiment, the movable contact is a key mechanism in CBs, and an encoder is installed on the movable contact shaft of each of the CBs 320, 330, 340 . . . , 3x0. With every operation of the CBs 320, 330, 340 . . . , 3x0, either opening or closing, time-domain angle waveform can be measured using the encoder, which indicates how the movable contact moves during the operation. This waveform is further converted into linear displacement waveforms of the movable contact, i.e. the travel curve 321C, 331C, 341C . . . , 3x1C and the travel curves 321D, 331D, 341D . . . , 3x1D, as shown in FIGS. 3A and 3B, each graphing a collection of the travel curves of the CBs 320, 330, 340 . . . , 3x0. It is evident that the travel curve waveforms are not only inconsistent but quite distributive and uncertain. Thus it is difficult to tell if a travel curve is normal by visual inspection against the standard travel curve.

Figure 5A:
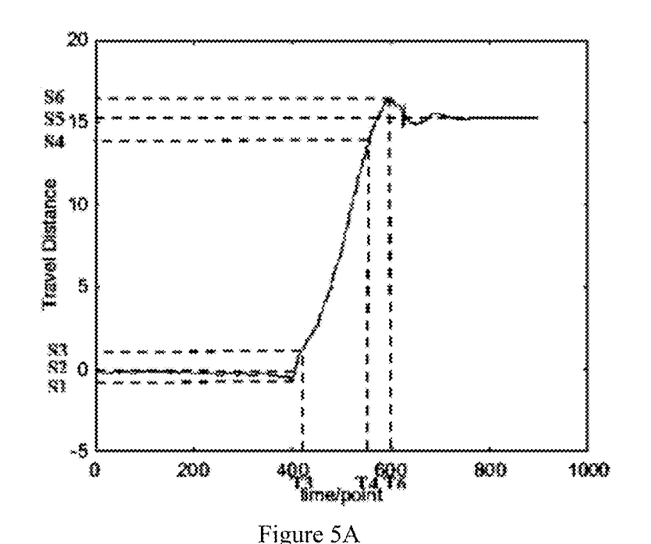
FIG. 5A and FIG. 5B are graphs of an exemplary traces of feature components of travel curve of CB in opening operation and in closing operation.
Figure 5B:
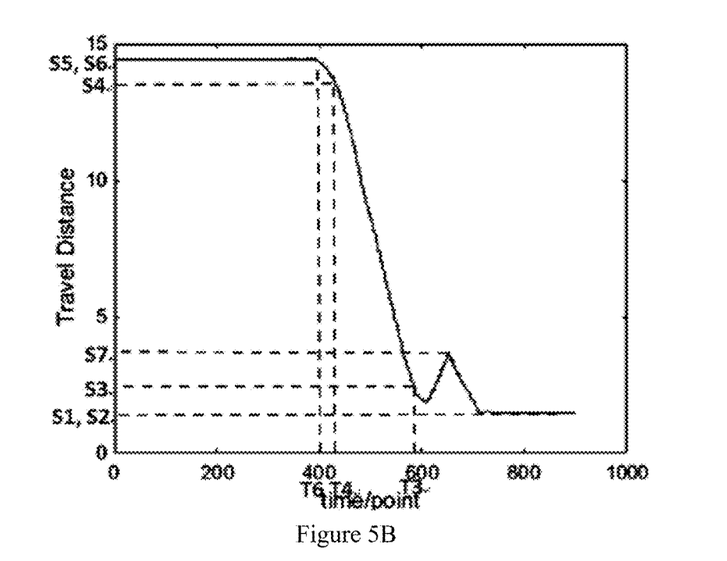

FIG. 5A and FIG. 5B are graphs of an exemplary traces of feature components of travel curve of CB in opening operation and in closing operation. The graphs of FIG. 5A and FIG. 5B include an x-axis indicative of time and a y-axis illustrating the travel. Preferably, a low-frequency component of the CB travel curve includes at least one of: opening/closing speed of a movable contact of the circuit breaker, total travel of the movable contact, timing of the opening/closing, travel of the movable contact, and over travel of the movable contact. The opening/closing speed of a movable contact of the circuit breaker is calculated between two points on the travel curve as defined by the speed calculation zone. The speed calculation zone is part of the circuit breaker type specific default settings and matches the points used for off-line timing. The total travel of the movable contact refers to the distance traveled from minimum to maximum position, so it includes over travel of the movable contact. The timing of the opening/closing refers to the time calculated between the two points on the travel curve as defined by the speed calculation zone. The travel of the movable contact refers to the distance from where the movable starts to move until it reaches a position where the arcing contacts meet per design. This position is referred to as the "travel" and is measured from the fully closed position. The operation cycle covers a period when the circuit breaker starts from closing to opening or vice versa.

In particular for example, the collected travel curve should be parameterized for lowering data dimension. As shown in FIG. 5A and FIG. 5B, for travel curve monitored in closing operation, feature data are extracted in the Table below, where $S_1$ is the minimum value of travel curve, $S_2$ is the value of starting point, $S_5$ is the value of curve end, and $S_6$ is the maximum value. Travel curve measured in opening operation, besides the 5 features similar to what's extracted for closing data, an additional feature S7 is also marked, as in FIG. 5B. For certain types of CB, a little 'rebound' might appear at the end of closing travel curve, and some defect can lead to abnormal rebound amplitude.

| component | definition |
|---|---|
| feature component 1 | Closing speed = $(S_4 - S_3)/(T_4 - T_3)$ |
| feature component 2 | Total stroke = $S_6 - S_1$ |
| feature component 3 | Move time = $T_4 - T_3$ |
| feature component 4 | Contact stroke = $S_5 - S_2$ |
| feature component 5 | Over stroke = $S_6 - S_5$ |
| feature component 6 | $S_3 = S_2 + (S_5 - S_2) \cdot 5\%$ |
| feature component 7 | $S_3 = S_2 + (S_5 - S_2) \cdot 5\%$ |

Therefore, for each of the travel curves 321C, 331C, 341C . . . , 3x1C in the opening operation, the controller 316 can obtain a set of feature data representing the respective measurements of operating condition related signal, in this embodiment (the first embodiment), data 321C, 331C, 341C . . . , 3x1C representing the travel curves of the respective CBs 320, 330, 340 . . . , 3x0 in the opening operation. For each of the data 321C, 331C, 341C . . . , 3x1C, a set of feature data can be obtained involving at least one of the feature components, namely opening/closing speed of a movable contact of the circuit breaker, total travel of the movable contact, timing of the opening/closing, travel of the movable contact, and over travel of the movable contact. In addition, for each of the travel curves 321D, 331D 341D . . . , 3x1D in the closing operation, the controller 316 can obtain a set of feature data representing the respective measurements of operating condition related signal, in this embodiment (the first embodiment), data 321D, 331D, 341D . . . , 3x1D representing the travel curves of the respective CBs 320, 330, 340 . . . , 3x0 in the closing operation. For each of the data 321D, 331D, 341D . . . , 3x1D, a set of feature data can be obtained involving at least one of the feature components.

Figure 6A:
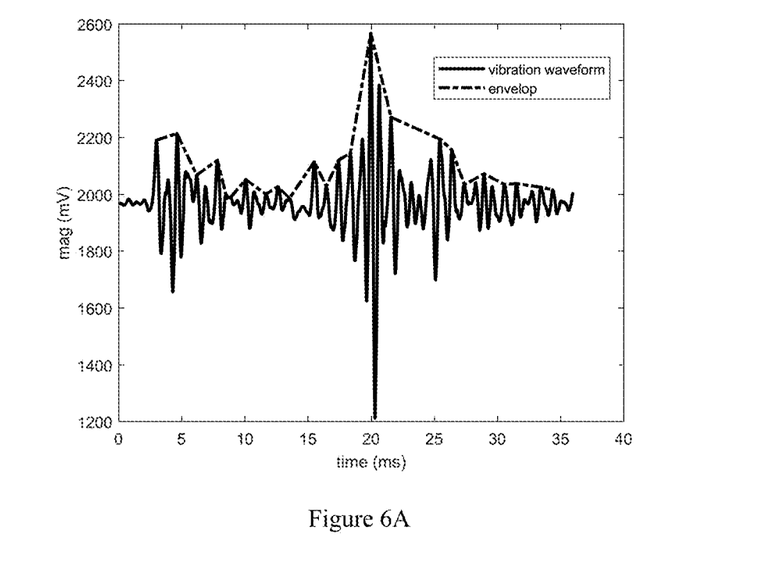
FIG. 6A and FIG. 6B are graphs of an exemplary traces of feature components of vibration signal curve of CB in opening operation and in closing operation.
Figure 6B:
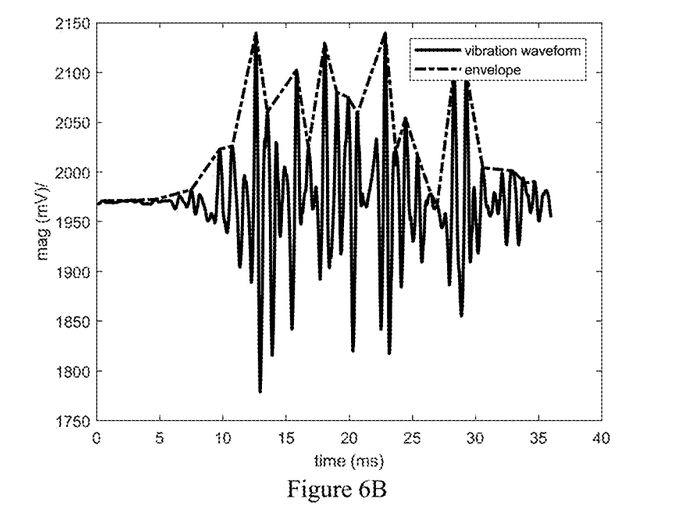

As an alternative, the set of feature data can be obtained according to the second embodiment. Vibration sensor is widely applied in CB monitoring as well. FIG. 6A and FIG. 6B are graphs of an exemplary traces of feature components of vibration signal curve of CB in opening operation and in closing operation. The graphs of FIG. 6A and FIG. 6B include an x-axis indicative of time and a y-axis illustrating the vibration signal amplitude. As shown in FIG. 6A and FIG. 6B, an example of the collective vibration curve, there exist a few pulses during opening and closing operation of CB, and the sequence and shape (peak value, damping) are dependent on mechanism moving and impact of the CB contact, thus is good for detection the mechanical defect. For example, the resonance of the CB chamber can be used representing the vibration of the movable contact of CB. Usually the vibration signal is filtered before processing, in order to magnify amplitude of the characteristic resonance of the CB chamber, FIG. 6A and FIG. 6B show opening-operation and closing-operation waveform processed by wavelet db4, based on which geometric feature can be extracted, like the peak-peak value, occurrence instant of each pulse (each pulse can be separated by the envelope line), etc.

Therefore, for each of the vibration curves 321E, 331E, 341E . . . , 3x1E in the opening operation, the controller 316 can obtain a set of feature data representing the respective measurements of operating condition related signal, in this embodiment (the second embodiment), data 321E, 331E, 341E . . . , 3x1E representing the vibration curves of the respective CBs 320, 330, 340 . . . , 3x0 in the opening operation. For each of the data 321E, 331E, 341E . . . , 3x1E, a set of feature data can be obtained involving at least one of the feature components, involving the peak-peak value and occurrence instant of each pulse. In addition, for each of the vibration curves 321F, 331F 341F ..., 3x1F in the closing operation, the controller 316 can obtain a set of feature data representing the respective measurements of operating condition related signal, in this embodiment (the second embodiment), data 321F, 331F, 341F ..., 3x1F representing the vibration curves of the respective CBs 320, 330, 340 ..., 3x0 in the closing operation. For each of the data 321F, 331F, 341F ..., 3x1F, a set of feature data can be obtained involving at least one of the feature components.

Figure 7A:
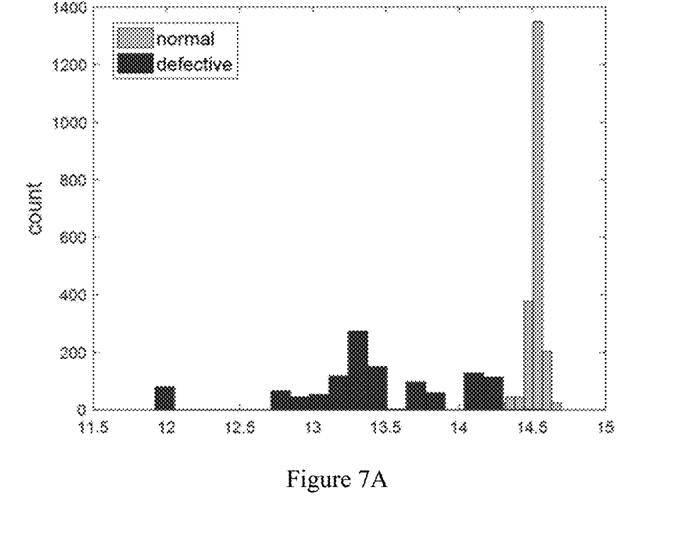
FIG. 7A shows feature components of normal and defective CBs.
Figure 7B:
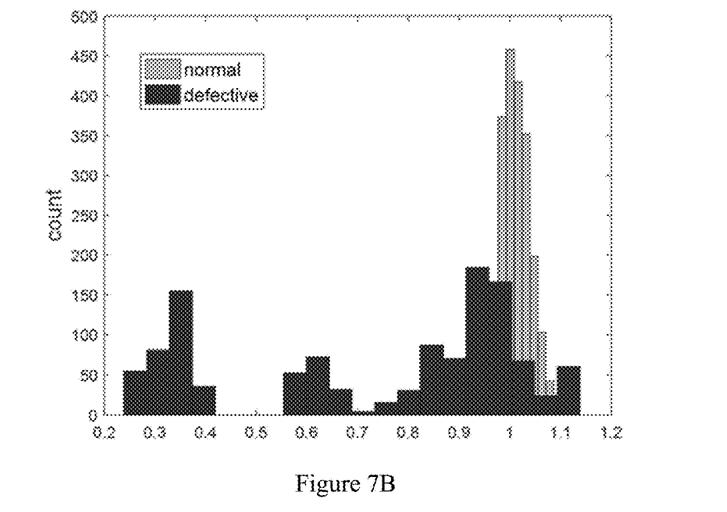
FIG. 7B shows an example of worse case with feature component, in which feature components of normal samples overlap with those of defective samples.

Defects are not sensitive to all components of feature data, and different feature data components could have strong whereas unknown correlation within them, which provides little information yet unnecessarily, increases the data size. This could cause sparsity of training data and vulnerability to noises. Therefore it is preferable to reduce the feature data dimension. Moreover, this step improves visuality of the data as well. Reduction dimension could be done based on either domain knowledge or numerical methods like PCA (principle component analysis). Taking travel curve as an example. Based on experimental data of an ABB VD4 circuit breaker, we found that the feature component 4 is quite sensitive to defect occurrence. Normal and defective CBs are more clearly distinguishable by this component, compared to other ones, as shown in FIG. 7A. As shown in FIG. 7B, the figure gives an example of worse case with feature component 5, in which features of normal samples overlap with those of defective samples.

Rather than comparing the data representing the measurements of operating condition related signal to a reference model built on CB's normal data, the embodiment according to present invention applies cluster analysis of the set of feature data representing the respective measurements of operating condition related signal. Cluster analysis or clustering is the task of grouping a set of objects in such a way that objects in the same group (called a cluster) are more similar (in some sense) to each other than to those in other groups (clusters). The cluster analysis uses one of the algorithms including connectively-based clustering, centroid-based clustering, distribution-based clustering, and density-based clustering. By utilizing unsupervised machine learning method to identify abnormally operating CBs in a fleet by comparing its data with those of its neighbours, the one who is behaving differently from neighbours would be identified as a defective one. The method does not need a reference "normal" database for comparison.

According to the embodiments of present invention, the controller 316 perform cluster analysis of the set of feature data based on a similarity threshold, so as to identify the normal cluster (majority of neighbours) and outliers (abnormal points far away from the normal cluster) using unsupervised machine learning methods. There are many data mining methods to detect so-called "outliers", including both parameterized and data-driven methods.

For example in the "travel curve" case according to the first embodiment, the feature data of travel curves highly satisfies "Gaussian distribution", and the feature data gave little correlation with the operation point, temperature, etc. Hence we use this parameterized method to model the normal cluster. Assuming the samples after dimension reduction are:

$$\{x^{(1)}, x^{(2)}, \ldots, x^{(m)}\}$$

where m is the number of samples, and x is in n dimension.

$$p(x; \mu, \Sigma) = \frac{1}{(2\pi)^{\frac{n}{2}} |\Sigma|^{1/2}} e^{-\frac{1}{2}(x-\mu)^T \Sigma^{-1}(x-\mu)}$$

The parameters mean value and covariance matrix are obtained by the maximum likelihood method:

$$\begin{cases} \mu = \frac{1}{m}\sum_{i=1}^{m} x^{(i)} \\ \Sigma = \frac{1}{m}\sum_{i=1}^{m} (x^{(i)} - \mu)(x^{(i)} - \mu)^T \end{cases}$$

Figure 8A:
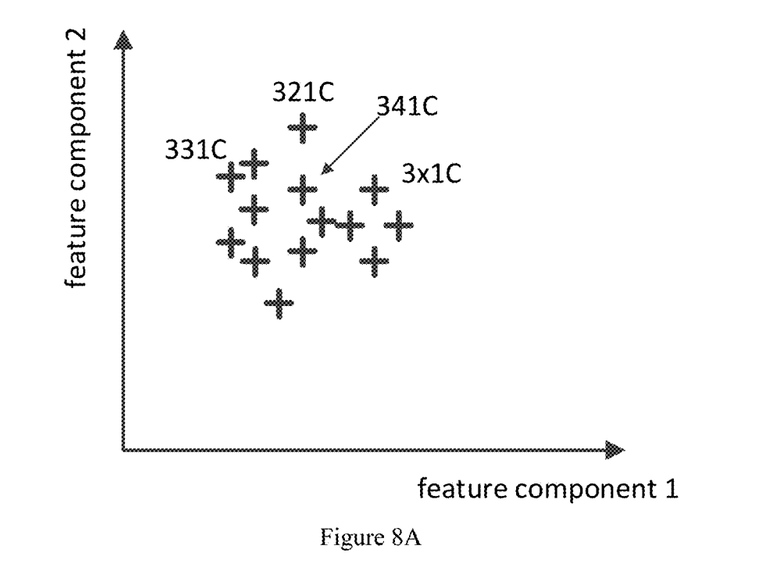
FIG. 8A, FIG. 8B and FIG. 8C are graphs showing examples of different scenarios of the relations of the feature data to the clusters.
Figure 8B:
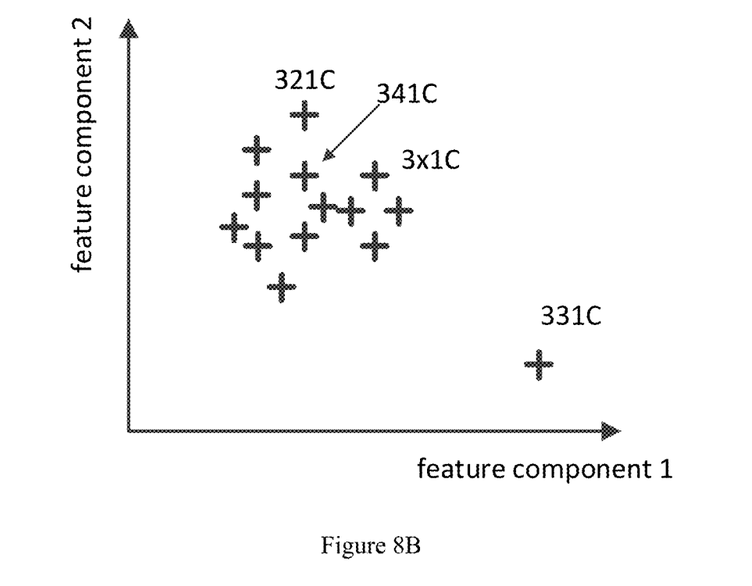
Figure 8C:
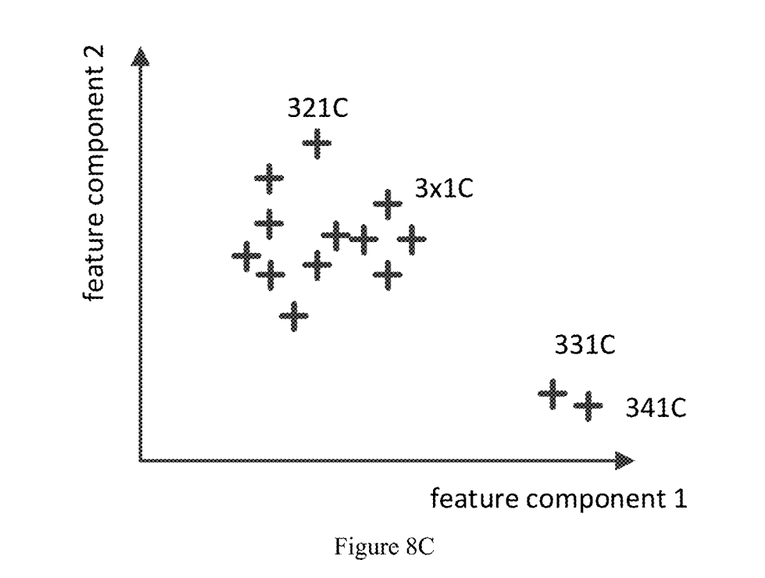

Some of the possible results are shown graphically in FIG. 8A, FIG. 8B and FIG. 8C. Based on the clustering approach of the present invention, the controller 316 generates a signal indicating the condition of the fleet of CBs 320, 330, 340 ..., 3x0 based on the cluster number resulted from the performance of the cluster analysis.

For example, as shown in FIG. 8A, all the feature data extracted from data 321C, 331C, 341C ..., 3x1C representing the travel curves of the respective CBs 320, 330, 340 ..., 3x0 in the opening operation or data 321D, 331D, 341D ..., 3x1D representing the travel curves of the respective CBs 320, 330, 340 ..., 3x0 in the closing operation are classified belonging to one cluster, from which it is derivable that no CB in the fleet behaves differently from its neighbour, then the controller 316 generates a signal indicating the condition of the fleet of circuit breakers where no CB is abnormal. For example, the set of the feature data FD1, FD2, FD3, ..., FDm includes m individual feature data, each of which is associated with the operating condition of a particular CB in an instance of opening/closing operation. Consequently, when a particular CB performs in more than one instances of opening operation, for example it opens twice, two individual feature data will be extracted respectively representing the travel curves involving the two instances of opening operation. Similar description applies to the feature data associated with the travel curves involving the instance of closing operation, as well.

FIG. 8B shows the feature data, for example involving the data 331C of CB 331 in an instance of opening operation, is classified to cluster I different to the other cluster II which the feature data 321C, 341C, 351C ..., 3x1C involving the rest of CBs belong to, then the controller 316 generates a signal indicating the condition of CB 331 is abnormal.

FIG. 8C shows more feature data, for example two feature data involving the data 331C, 341C of CB 331, 341 in instances of opening operation, are classified into cluster I different to the other cluster II which the feature data 321C, 351C, 361C ..., 3x1C involving the rest of CBs belong to, then the controller 316 generates a signal indicating the condition of CB 331, 341 is abnormal. In summary, that the signal indicates the abnormal condition of the fleet of circuit breakers where the cluster number is above one.

Preferably, the signal's indication of the abnormal condition includes identifying the circuit breaker as abnormal where the feature data representing its operating condition related signal was grouped in the cluster having the less number of feature data than at least one of the rest of the clusters. For example as shown in FIG. 8B, the CB 331 in the cluster I is recognized as abnormal where the number of the set of feature data belonging to cluster I, "1", is less than the number of the set of feature data belong to cluster II, "x−1". Alternatively, as shown in FIG. 8C, the CBs 331, 341 in the cluster I are recognized as abnormal where the number of the set of feature data belonging to cluster I, "2", is less than the number of the sets of feature data belong to cluster II, "x−2".

Preferably, the measurements are substantially synchronously performed by the at least one sensor.

Preferably, the storage unit is configured to storing a history profile of the fleet of circuit breakers. And, the controller is further configured to calculate and obtain the similarity threshold from history profile of the fleet of circuit breakers.

Preferably, the controller is further configured to generate a signal indicating a level of normal condition for each of the circuit breakers whose feature data were grouped in the rest of the clusters based on its similarity with the rest of circuit breakers in the same cluster. It is to evaluate how far a new sample is deviated from the normal cluster. The simplest idea is to calculate the Euclidian distance between the tested feature data and the centre of the normal cluster. Nevertheless, there could still exists correlation among the 3 components after dimension reduction, i.e. the sample distribution is not uniform along different axis in the data space. See FIG. 9, though samples A and B have identical Euclidian distance to the centre, sample B is obviously more abnormal than A, because much fewer samples exist in the neighbourhood of B, which means B is far rarer.

Figure 9:
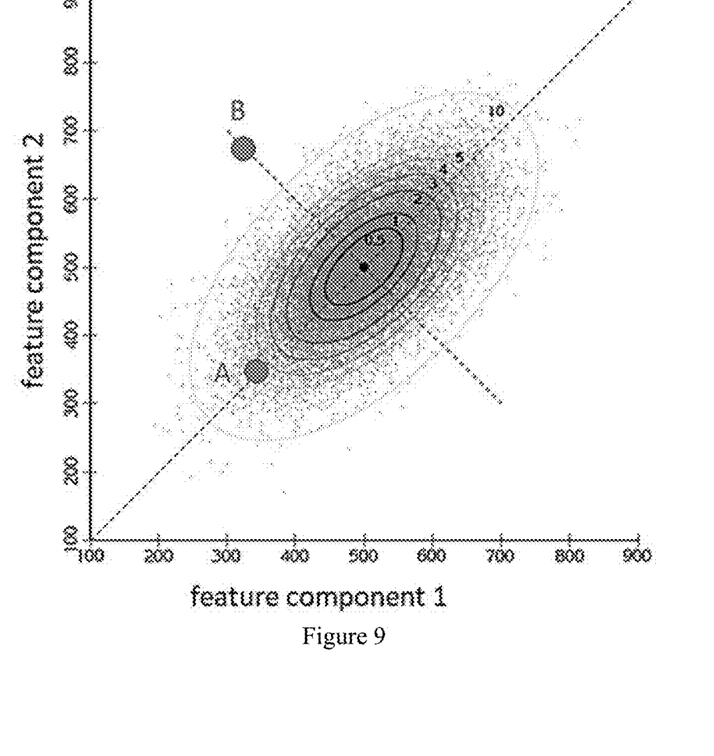
FIG. 9 shows an example of Euclidian distance between the tested feature data and the centre of the normal cluster.

Hence, we propose to use Mahalanobis distance (M distance) to represent the deviation. Then distance between sample x and the normal cluster's centre is:

$$D = \sqrt{(x-\mu)^T \Sigma^{-1} (x\mu)}$$

With the definition, it can be proved that samples with identical probability are equally deviated from the centre. The Mahalanobis distance takes the correlation and statistical behaviour of the majority normal cluster into consideration, and is strictly proportional to abnormality level. With the definition, in FIG. 9, sample B is far more off the center than A, as expected. The M distance of A is 5, and the M distance of B is 18.

Figure 10:
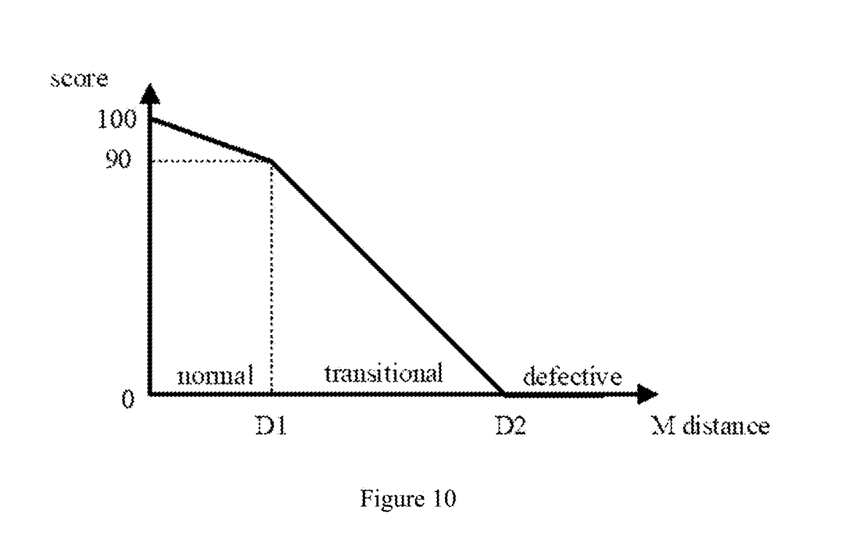
FIG. 10 shows a mapping of the deviation of FIG. 9 to a health score ranging according to an embodiment of present invention.

Last, the deviation should be mapped to a health score ranging from 0 to 100 points. Here the mapping function is defined in a piecewise way, see FIG. 10. In experiments, we find that M distance of normal samples is no higher than 25, whereas M distance of defective samples is at least 100, and see the distribution of normal samples in FIG. 11. Reasonably in FIG. 10, the threshold D1 is set to 50, and D2 is set to 200. The three pieces of curves represent normal, transitional, and abnormal zones, respectively. Note that normal CBs have a score no less than 90.

Figure 11:
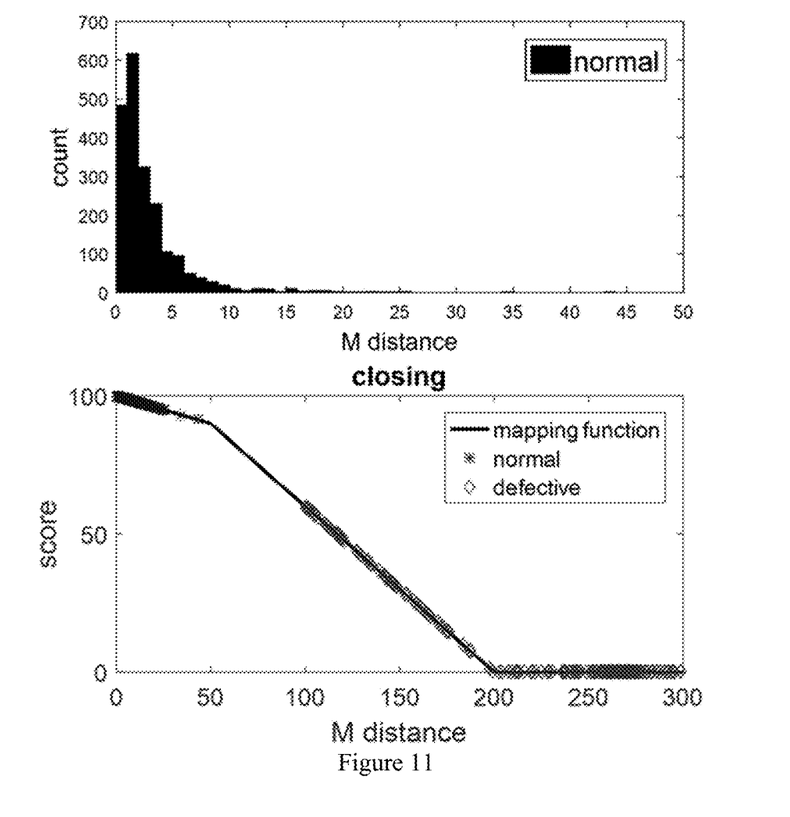
FIG. 11 shows the distribution of normal samples according to an example of an embodiment of present invention.

The solution is validated on experimental data. 2000 normal samples and 1100 defective samples are collected to test the health evaluation method. FIG. 11 shows the results: normal samples' M distances are evidently closer than defective samples, and the score is no less than 90. Some defective samples enter the transitional zone, and their score decreases down to lower than 60. Most defective samples are in the defective zone.

Figure 12:
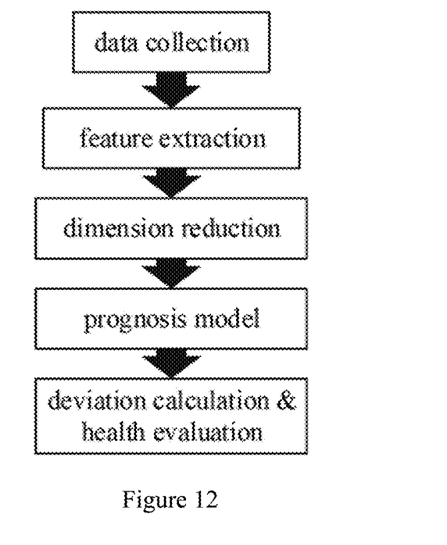
FIG. 12 shows a flow chart of a method according to one embodiment of the invention.

A flow chart 700 showing a method according to one embodiment of the invention is shown in FIG. 12. First we gather a number of raw data samples of a fleet of CBs, collected by a certain type of sensor. The signal type could be travel curve, vibration signal, motor current, coil current, and PD, etc. Then we extract the characteristic feature to represent the complex raw data. After normalization, we carry out dimension reduction and reduce the data dimension to a lower one, typically 3. Next, for building a prognosis model, we separate the normal cluster of feature samples from the rest using data mining or machine learning techniques, e.g. Kmeans, Gaussian distribution, or outlier detectors, etc., based on which we calculate deviation between each sample and the normal cluster. Finally the deviation is mapped into a score to indicate the CB's health status.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for monitoring condition of a fleet of circuit breakers, including:
    measuring at least one type of operating condition related signal for each respective circuit breaker in the fleet of circuit breakers during their operation;
    obtaining a set of feature data corresponding to data extracted from circuit breakers in the fleet of circuit breakers representing respective measurements of operating condition related signals for the fleet of circuit breakers;
    performing cluster analysis of the set of feature data obtained from the fleet of circuit breakers based on grouping the fleet of circuit breakers into one or more clusters and based on a similarity threshold;
    identifying an abnormally operating circuit breaker from the other circuit breakers in the fleet of circuit breakers based on the cluster analysis; and
    generating a signal indicating a condition of the fleet of circuit breakers based on a cluster number resulted from the cluster analysis performed on the fleet of circuit breakers;
    wherein the measuring of the at least one type of operating condition related signal for each respective circuit breaker in the fleet of circuit breakers are substantially synchronously performed;
    wherein the abnormally operating circuit breaker is identified by comparing the feature data of the abnormal circuit breaker with the feature data of the other circuit breakers in a cluster of the one or more clusters;
    wherein the signal indicates an abnormal condition of the fleet of circuit breakers where a cluster number is above one;
    wherein the signal's indication of the abnormal condition includes identifying the abnormally operating circuit breaker as abnormal where the set of feature data representing its operating condition related signal was grouped in a cluster having a less number of feature data than at least one of a rest of the one or more clusters;
    wherein the cluster number is representative of the number of feature data in the set of feature data;
    wherein the at least one type of operating condition related signal is selected from the group consisting of a travel curve signal, a vibration signal, a coil current signal, a motor current signal, and a PD signal of the respective circuit breaker.

2. The method according to claim 1, wherein the cluster analysis uses algorithms,
    wherein one of the algorithms including connectively-based clustering, centroid-based clustering, distribution-based clustering, and density-based clustering.

3. The method according to claim 1, wherein obtaining the set of feature data further includes processing of the set of feature data so as to remove its components insignificantly representing an abnormal condition of the respective circuit breaker.

4. The method according to claim 1, further including:
calculating and obtaining the similarity threshold from history profile of the fleet of circuit breakers.

5. The method according to claim 1, further including:
generating a second signal indicating a level of normal condition for each of the fleet of circuit breakers whose feature data were grouped in one of a rest of the one or more clusters based on its similarity with the rest of the circuit breakers in a same cluster.

6. A system for monitoring condition of a fleet of circuit breakers, including:
at least one sensor, being configured to measure at least one type of operating condition related signal for each respective circuit breaker in the fleet of circuit breakers during their operation; and
a controller, being configured to:
obtain a set of feature data corresponding to data extracted from circuit breakers in the fleet of circuit breakers representing respective measurements of operating condition related signals for the fleet of circuit breakers, wherein the measuring of the at least one type of operating condition related signal for each respective circuit breaker in the fleet of circuit breakers are substantially synchronously performed;
perform cluster analysis of the set of feature data obtained from the fleet of circuit breakers based on grouping the fleet of circuit breakers into one or more clusters and based on a similarity threshold;
identifying an abnormally operating circuit breaker from the other circuit breakers in the fleet of circuit breakers based on the cluster analysis,
wherein the abnormally operating circuit breaker is identified by comparing the feature data of the abnormal circuit breaker with the feature data of the other circuit breakers in a cluster of the one or more clusters; and
generate a signal indicating a condition of the fleet of circuit breakers based on a cluster number resulted from a performance of the cluster analysis on the fleet of circuit breakers;
wherein the signal indicates an abnormal condition of the fleet of circuit breakers where the cluster number is above one, and wherein the signal's indication of the abnormal condition includes identifying the abnormally operating circuit breaker as abnormal where the set of feature data representing its operating condition related signal was grouped in a cluster having a less number of feature data than at least one of a rest of the one or more clusters;
wherein the cluster number is representative of the number of feature data in the set of feature data;
wherein the at least one type of operating condition related signal is selected from the group consisting of a travel curve signal, a vibration signal, a coil current signal, a motor current signal, and a PD signal of the respective circuit breaker.

7. The system according to claim 6, wherein:
the cluster analysis uses algorithms,
wherein one of the algorithms including connectively-based clustering, centroid-based clustering, distribution-based clustering, and density-based clustering.

8. The system according to claim 6, wherein:
the controller further processes the set of feature data so as to remove its components insignificantly representing an abnormal condition of the respective circuit breaker.

9. The system according to claim 6, further including:
a storage unit, being configured to storing a history profile of the fleet of circuit breakers;
wherein:
the controller is further configured to calculate and obtain a similarity threshold from the history profile of the fleet of circuit breakers.

10. The system according to claim 6, wherein:
the controller is further configured to generate a second signal indicating a level of normal condition for each of the circuit breakers whose set of feature data were grouped in a rest of the one or more clusters based on its similarity with the rest of circuit breakers in a same cluster.

11. A system, including:
a fleet of circuit breakers;
at least one sensor, being configured to measure at least one type of operating condition related signal for each respective circuit breaker in the fleet of circuit breakers during their operation, wherein the measuring of the at least one type of operating condition related signal for each respective circuit breaker in the fleet of circuit breakers are substantially synchronously performed;
a controller, being configured to:
obtain a set of feature data corresponding to data extracted from circuit breakers in the fleet of circuit breakers representing the respective measurements of operating condition related signals for the fleet of circuit breakers,
perform cluster analysis of the set of feature data obtained from the fleet of circuit breakers based on grouping the fleet of circuit breakers into one or more clusters and based on a similarity threshold,
identify an abnormally operating circuit breaker from the other circuit breakers in the fleet of circuit breakers based on the cluster analysis,
wherein the abnormally operating circuit breaker is identified by comparing the feature data of the abnormal circuit breaker with the feature data of the other circuit breakers in a cluster of the one or more clusters; and
generate a signal indicating a condition of the fleet of circuit breakers based on a cluster number resulted from the performance of a cluster analysis on the fleet of circuit breakers,
wherein the signal indicates an abnormal condition of the fleet of circuit breakers where the cluster number is above one, and wherein the signal's indication of the abnormal condition includes identifying the abnormally operating circuit breaker as abnormal where the set of feature data representing its operating condition related signal was grouped in a cluster having a less number of feature data than at least one of a rest of the one or more clusters; and
a server, being configured to receive the signal indicating the condition of the fleet of circuit breakers;
wherein the cluster number is representative of the number of feature data in the set of feature data;
wherein the at least one type of operating condition related signal is selected from the group consisting of a travel curve signal, a vibration signal, a coil current signal, a motor current signal, and a PD signal of the respective circuit breaker.

\* \* \* \* \*